United States Patent
Marschner

(10) Patent No.: US 6,675,454 B1
(45) Date of Patent: Jan. 13, 2004

(54) METHOD FOR RECYCLING USED PRINTED CIRCUIT BOARDS

(76) Inventor: Tobias Marschner, Sudontenar 5, Kaufbeuren (DE), 87600

(*) Notice: Subject to any disclaimer, the term of this patent is extended or adjusted under 35 U.S.C. 154(b) by 0 days.

(21) Appl. No.: 09/601,212

(22) PCT Filed: Jan. 5, 1999

(86) PCT No.: PCT/DE99/00011
§ 371 (c)(1),
(2), (4) Date: Sep. 11, 2000

(87) PCT Pub. No.: WO99/39556
PCT Pub. Date: Aug. 5, 1999

(30) Foreign Application Priority Data

Jan. 30, 1998 (DE) .......................... 198 03 692

(51) Int. Cl.⁷ .......................... B23P 19/04; H01B 15/00; H02G 1/12
(52) U.S. Cl. .................. 29/403.3; 29/403.1; 228/119; 228/262.9
(58) Field of Search ............ 29/403.1–403.3, 29/846; 228/119, 264, 19, 20.1, 20.5

(56) References Cited

U.S. PATENT DOCUMENTS

| | | | | |
|---|---|---|---|---|
| 4,768,699 A | * | 9/1988 | Abbagnaro | 228/102 |
| 5,401,689 A | * | 3/1995 | Frei et al. | 29/830 |
| 5,715,592 A | * | 2/1998 | Mori et al. | 29/762 |

FOREIGN PATENT DOCUMENTS

| | | |
|---|---|---|
| DE | 42 05 405 C 1 | 8/1993 |
| DE | 43 23 217 C 1 | 8/1994 |
| DE | 43 30 677 A 1 | 3/1995 |
| DE | 43 37 970 A 1 | 5/1995 |
| DE | 196 19 965 A 1 | 11/1996 |
| DE | 195 48 213 A 1 | 6/1997 |

* cited by examiner

Primary Examiner—Richard Chang
(74) Attorney, Agent, or Firm—Oliff & Berridge, PLC

(57) ABSTRACT

A method of recycling used printed boards includes the steps of removing components from the used printed boards or parts of them and joining the resulting used printed boards to form a composite board. The method further provides for separating outer conductor paths from the used printed boards, combining several boards in layers, aligning the fibres, and/or forming the boards into uniform sizes.

11 Claims, 4 Drawing Sheets

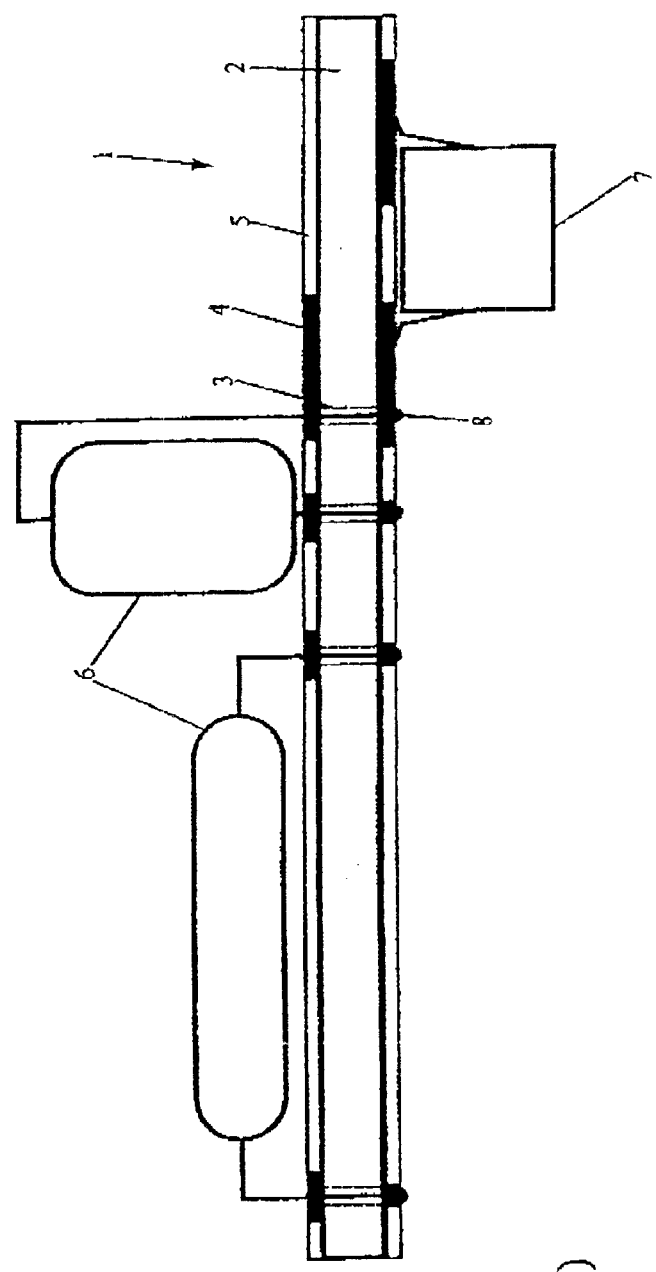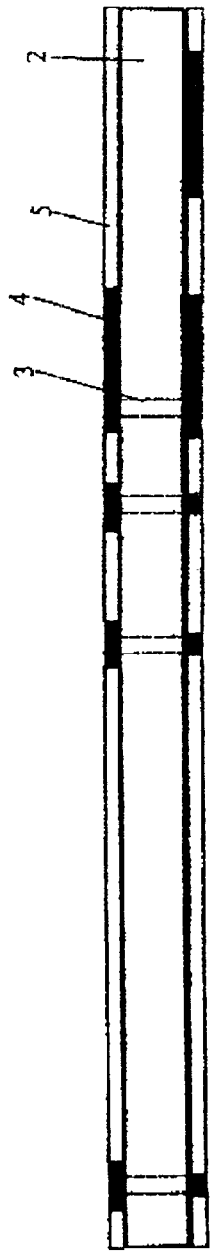
FIG. 1(a)
FIG. 1(b)

METHOD FOR RECYCLING USED PRINTED CIRCUIT BOARDS

BACKGROUND OF THE INVENTION

1. Field of the Invention
2. Description of the Related Art

Printed circuit boards play a very important role in many of today's electric and electronic appliances. Using a lot of energy these type of boards are made of different materials, for example plastics, fibre materials, metals etc. The electric and/or electronic components on the boards differ greatly, for example there are tranistors, capacitors, resistors, integrated switches, processors etc. Electric and electronic compliances pose a particular problem because not only do parts break down they also become technically out of date within a very short period of time. A classic example of this is the area of computer technology.

Different methods have been suggested to try to combat the waste of raw materials and environmental pollution through the ever increasing load of scrap electronic waste. As far as printed circuit boards are concerned the main problem remains in the fact that different materials are either glued, soldered or struck together. Methods requiring a high energy demand are needed to separate the materials so that they can be recycled.

These kind of methods involve shredding the printed circuit boards into an equipped, partly equipped and unequipped state. However, the first 2 cases are a cause of concern when considering the environment. In the last case the components can be removed by soldering, planing down, chiselling off, grinding down or other similar processes. After this the printed circuit boards or pieces thereof are burnt in metallurgy works, mainly abroad. In this process the base material, made up of glass fibre and plastic or similar such materials, is also burnt The resulting melted down material is then refined.

The melting down process of the printed circuit boards causes the energy requirement to be high. Refining the melted down materials also requires further complex proceedings. For this reason, it is important to consider the cost benefit ratio.

SUMMARY OF THE INVENTION

It is the task of the following discovery to develop a method of recycling printed circuit boards and using this technique to produce a result that also achieves a good cost benefit ratio.

An innovative method to recycle printed circuit boards appears to involve the stabil joining of component-free printed circuit boards to produce one composite board. Using this method it will not be necessary to melt down or burn the used printed circuit boards, thus reducing the energy requirement. As a result the final product shall achieve a good cost benefit ratio as far as the economic situation is concerned. When laid out next to each other or put in layers the used printed circuit boards can be made up into a composite board.

The outer conductor paths from the used printed circuit boards shall be carefully removed so that the material from the conductor paths can be recycles The solder, for example tin, shall also be removed from the holes in the boards.

Furthermore several used printed circuit boards will be laid next to and layered on top of each other, resulting in a large composite board with any number of layers. The resulting composite board is very strong. The used boards shall be stuck together using a very strong glue.

The fibres within the used boards shall be so aligned to produce a layer in the composite board where the direction of these fibres is the same.

To make the processing easier the used boards could be cut into a single shape and size.

The used boards could also be shredded down and the resulting pieces pressed and stuck together forming a chipboard composite board.

Furthermore the used boards could be multilayer boards, that contain more than 2 levels with conductor paths, where a resulting additional effect is an electromagnetic shield.

It could also be possible to integrate at least one additional layer in the composite board. This additional layer could be made out of plastic, metal or a natural raw material. As a result the composite board could be strengthened, made more durable and/or an electromagnetic shield could be provided.

Using this new method a composite board will still be made out of component-free used board that are joined together. However, the result is produced without high energy requirement and can achieve a good cost benefit ratio, as the economic situation is concerned.

BRIEF DESCRIPTION OF THE DRAWINGS

The outer conductor paths from the used printed circuit boards are carefullly removed so that the material from the conductor paths can be recycled.

The solder, for example tin, can also removed from the holes in the boards.

Furthermore several used printed circuit boards are laid next to each other and layered on top of each other, so that a large composite board with any number of layers is made. The resulting composite board is very strong. The used boards am stuck together using a very strong glue.

The fibres within the used boards are so aligned to produce a layer in the composite board where the direction of these fibres is the same.

To make the processing easier the used boards could be cut into a single shape and size.

The used boards can also be shredded down and the resulting pieces pressed and stuck together forming a chipboard composite board.

Furthermore the used boards can be multilayer boards, that contains more than 2 levels with conductor paths, where a resulting additional effect is an electromagnetic shield.

Furthermore it is possible to integrate at least one additional layer in the composite board. This additional layer can be made out of plastic, metal or a natural raw material. As a result the composite board can be strengthened, made more durable and/or an electromagnetic shield can be provided.

The above mentioned discovery will be explained further using the following enclosed diagrams.

DESCRIPTION OF THE EXEMPLARY EMBODIMENTS

As shown:

FIGS. 1(a) to 1(e) Steps in the method to recycle used printed circuit boards according to the first example.

Figure 2:
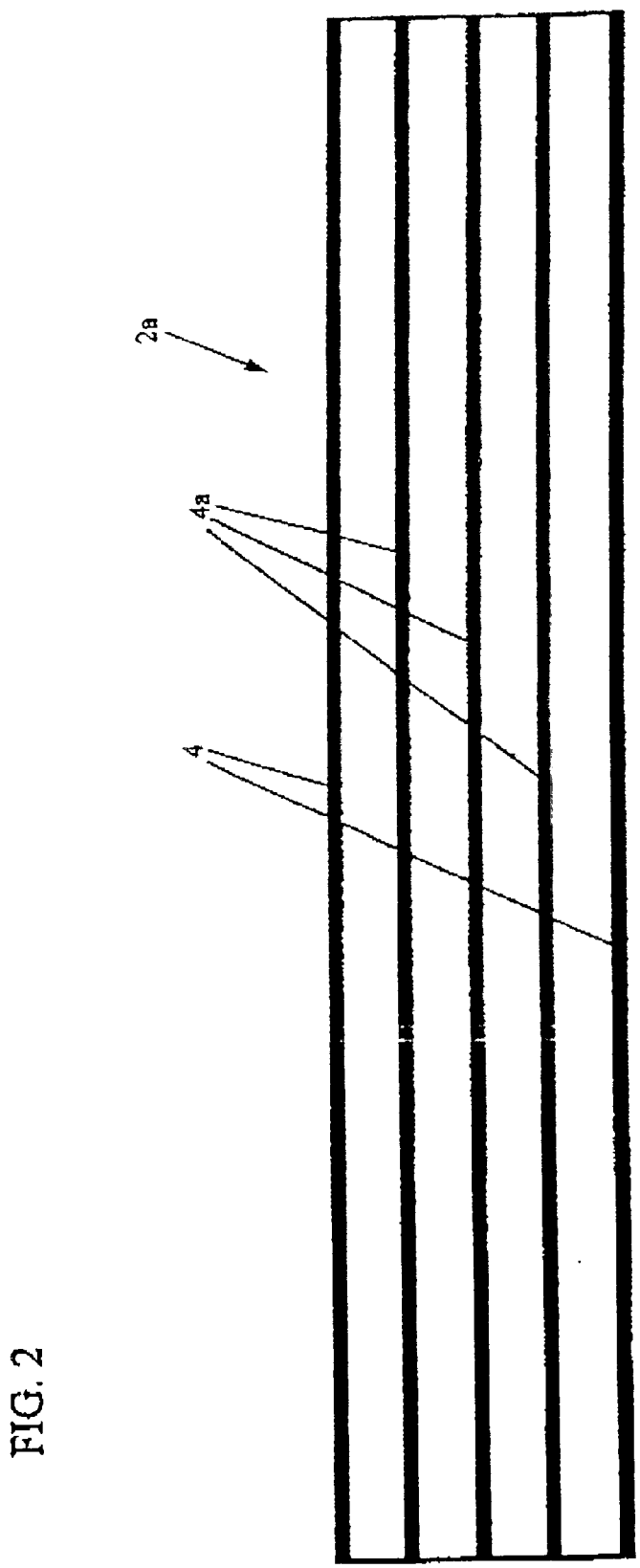

FIG. 2 A diagram of a multilayer board as used in the second example.

Examples of the submitted discovery are described in detail below.

Firstly it must be pointed out, that the use of the submitted discovery is not restricted to the following described type of printed circuit boards. Any type of printed circuit board can be used. These types include single faced and double faced printed circuit boards, printed circuit boards with conductor paths on one or both surfaces, printed circuit boards solely equipped using HDI technology that is to say surface installation technique, or printed circuit boards solely equipped using the plated-through-hole technique or a combination of the last two mentioned techniques, or also multilayer plates, that contain more than two levels of conductor paths, that are not on the surface of the printed circuit boards.

A first example of the submitted discovery is described below.

FIGS. 1(a) to 1(e) show the steps in the method to recycle the used printed circuit boards. The result of this method is a composite board produced from used printed circuit boards.

FIG. 1(a) shows a customary printed circuit board (1). Note that this printed circuit board (1) is a double-sided equipped printed circuit board, with conductor paths (4) on both opposite surfaces. Furthermore, the component (6) shows the plated-through-hole technique and components (7) shows the HDI technique.

As shown in FIG. 1(a), the customary plate (1) consists of base material (2). This is usually made out of a combination of plastic and fiberglass enforced plastic. Holes (3) are planned in this base material (2). Furthermore, conductor paths (4) are planned in circuit board (1). There, conductor paths (4) are covered by a protective paint coating (5), e.g., a polyacrylic coating. The holds (3) are needed to solder the component (6) using plated through-hole technique, the connecting wires from component (6) are stuck into the holes (3) on one side of the circuit board and are soldered on the opposite side of the board. An HDI component (7) is also shown in FIG. 1.

As shown in FIG. 1(b) the components (6) and (7) are the first to be removed from the circuit board (1). They do not have to be removed in a specific way, They can be soldered out, planed down, chiseled off or ground down.

Figure 1C:
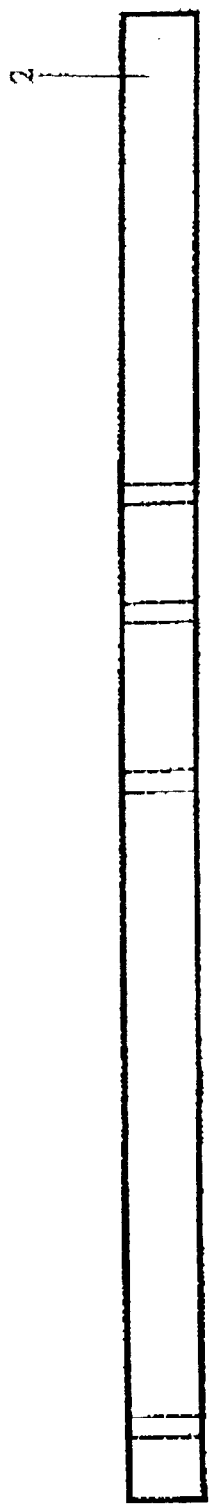

In the next step FIG. 1(c) the protective paint coating (5) and the conductor path (4) on both surfaces of the circuit boards (1) are removed by grinding them down. This kind of conductor path (4) is normally embedded in the first 0.2 mm of the protective paint coating (5). Once the conductor paths (4) have been ground down and removed, the metal from these conductor paths can be found in the remaining ground dust. About half of this remaining dust is made up of metal: 80%–90% is copper and the rest is solder, which means tin and other metals like gallium and indium, etc.

The metals can be recycled out of the dust. FIG. 1(c) shows the empty base material with the remaining holes (3). As a result of the above mentioned grinding process, the surface is now free of uneven points and/or has been made rough.

The above mentioned grinding down the circuit board is not always necessary, if the quality of the base material (2), the conductor paths (4) and protective paint coatings (5) is adequate and recycling of the conductor paths is not intended.

After the previous steps, if solder remains in the holes (3), it is possible to remove this solder from the component-free circuit boards (1) by applying thermal energy and using centrifugal force.

In a further optional steps, several base materials (2) that have been through the above processes can be made to a uniform size, e.g., by sawing. However, it must be noted that by increasing the number of fragments, the durability of the base material (2) when making up the composite board is reduced.

Figure 1D:
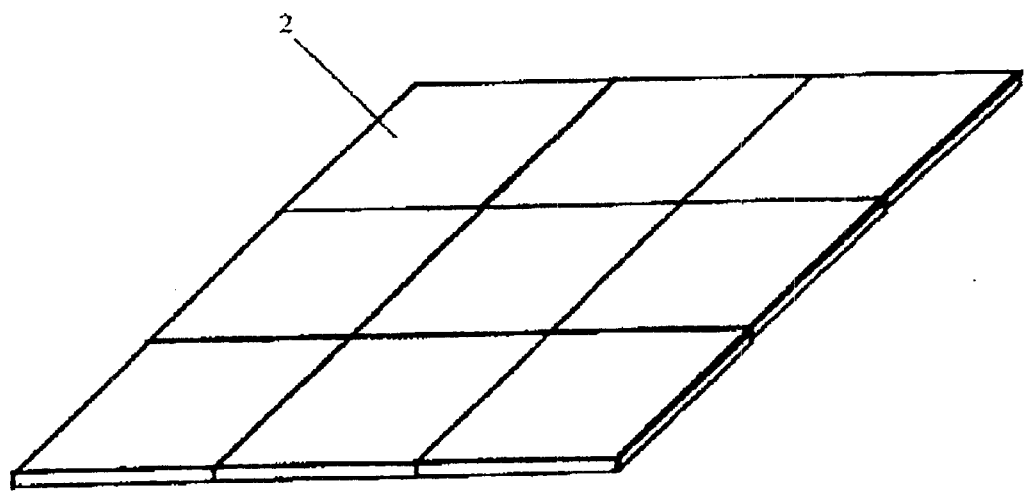

As shown in FIG. 1(d), the base material (2), processed according to the previous steps, has been laid out next to each other.

Figure 1E:
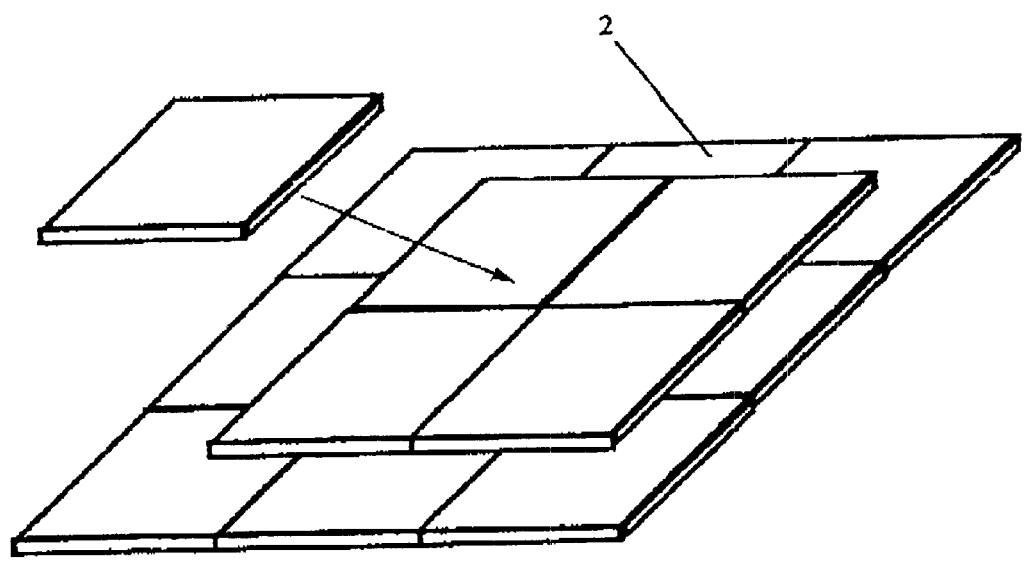

In the last step FIG. 1(e), the base material (2) is arranged to form layers. In FIGS. 1(d) and 1(e), an adhesive, e.g., a polyacryryl based glue, is used to form a set joint in the layers of the base material (2). The process of sticking the base material can be either a hot or a cold one. An alternative to sticking the base materials together is to rivet them or screw them together.

The steps of layering the base material (2) next to and on top of each other can be repeated as often as one wishes, so that a large composite board with any number of layers can be produced.

The composite board, produced using the above mentioned method, has been shown to offer certain advantages.

Circuit plate base materials are generally made from very strong materials, e.g. fibre glass and plastic or similar materials or material mixtures.

The composite board made according to the above mentioned method and said to be very strong.

The composite board can be used instead of plywood, plasterboard or chipboard etc.. It can replace every usual boarding material In particular the composite board is very suitable as a building material, because it is mechanically extremely strong and can be used for example when building bridges, earthquake-proof housing or as protection for military buildings.

A complete recycling of the materials contained in the used circuit boards is not carried out in the previous method described. The component-free used boards are used as the base material of the composite boards. A new product is created, which can also be added to the economic circulation. The necessity of carrying out the melting process which is very energy demanding also disappears, so that a good cost benefit ratio is achieved.

A second example of the submitted discovery is described below.

The second example of the submitted discovery is the same as the first except that a multilayer circuit board is used.

FIG. 2 shows a diagram of a base material (2a) for a multilayer circuit board. A multilayer circuit board has conductor paths on both surfaces of the substrate (2a) and further conductor paths (4a) inside the substrate (2a). Otherwise, the construction is the same as the construction of the circuit board (1) FIG. 1(a), and for this reason it is not shown once FIG. 2.

The procedure using the multilayer circuit board is the same as in the first example, however the copper metal conductor paths (4a) remain in the base material (2a). This is the reason why a composite board containing not only base material but also metal layers is produced. Therefore, this composite board is not only suitable for the aforementioned uses but also can be used as an electromagnetic shield because it creates the effect of a Faraday cage.

A third example of the submitted discovery is described below.

The third example differs from the first and second examples because after the procedures in the FIGS. 1(a) to 1(c) the resulting base material is then shredded into small chippings.

The shredded chippings will then be stuck together with a strong glue, in a similar process to that of making plywood For example a glue using a polyacryl base is very suitable and the adhesion process can be either hot or cold and if necessary also under pressure. Thus a composite board to made from shredded used board base materials. The resulting board is similar to a plywood board.

The shredded parts of the base material are made from strong material and stuck firmly together. Similarly the resulting composite board is just as strong as the composite boards in the previous two examples and can be used for same purposes.

A detailed description of the first to third examples follows below.

In order to achieve or improve the aforementioned electromagnetic shield one or several layers of metal e.g. copper or a precious metal can be put between the base material layers in the composite boards in the first and second examples.

A similar shield effect can be attained in the i example firstly by producing a composite board made out of shredded base material paths, then covering the surface with a layer of metal e.g. copper, then joining this to a second composite board on the metal layer. This procedure can be repeated often thus forming a composite board (as in the third example) with many metal layers that create an electromagnetic shield.

Other layers can be used in ways similar to those in the first to third examples. The durability of the composite board can be increased e.g. by using soft, flexible layers or by vulcanizing rubber. Other plastic layers or natural raw materials can also be used in this process.

In the first and second examples it is also possible to cut or saw the base material into pieces and to layer these pieces next to and on top of each other, so that the fibres in the single base material pieces are aligned so that the direction of the fibres in the composite board are the same.

As far as further unexplained effects and advantages of this invention concerned, see the figures.

What is claimed is:

1. A method of recycling used printed boards comprising:

removing a plurality of components from a plurality of used printed boards, each used printed board of the plurality of used printed boards having a mounting surface from which the plurality of components is removed; and joining the plurality of used printed boards to form a composite board of a plurality of layers, wherein the mounting surface of one of the used printed boards in a first layer overlaps with a plurality of mounting surfaces of the used printed boards in a second layer.

2. The method according to claim 1 wherein a plurality of outer conductor paths of the plurality of used printed boards is separated from the plurality of used printed boards.

3. The method according to claim 1 wherein solder is removed from a plurality of holes in the plurality of used printed boards.

4. The method according to claim 1 wherein several of the plurality of used printed boards are layered next to and on top of each other.

5. The method according to claim 4 wherein several of the plurality of used printed boards are firmly fixed to each other by using an adhesive.

6. The method according to claim 1 wherein fibres within the plurality of used printed boards are aligned with respect to each other.

7. The method according to claim 1 wherein the plurality of used printed boards is processed to having respective sizes which are uniform.

8. The method according to claim 1 wherein the plurality of used printed boards are shredded into a plurality of small pieces, and the plurality of small pieces are glued to each other under pressure.

9. The method according to claim 1 wherein a plurality of multilayered printed boards are used as the plurality of used printed boards and comprise more than two levels of conductor paths.

10. The method according to claim 1 wherein at least one additional layer is disposed in the composite board.

11. The method according to claim 10 wherein the at least one additional layer is made of plastic, metal or of a material formed at least partially of a natural reproductive raw material.

\* \* \* \* \*